United States Patent [19]

Terakawa et al.

[11] 4,450,484
[45] May 22, 1984

[54] SOLID STATES IMAGE SENSOR ARRAY HAVING CIRCUIT FOR SUPPRESSING IMAGE BLOOMING AND SMEAR

[75] Inventors: Sumio Terakawa, Osaka; Kenju Horii, Shiga, both of Japan

[73] Assignee: Matsushita Electronics Corporation, Osaka, Japan

[21] Appl. No.: 265,582

[22] Filed: May 20, 1981

[30] Foreign Application Priority Data

May 22, 1980 [JP] Japan .................................. 55-68358

[51] Int. Cl.³ .............................................. H04N 3/14
[52] U.S. Cl. .................................................. 358/213
[58] Field of Search ............................. 358/212, 213; 357/24 LR

[56] References Cited

U.S. PATENT DOCUMENTS

| | | | |
|---|---|---|---|
| 3,715,485 | 2/1973 | Weimer | 358/213 |
| 4,189,749 | 2/1980 | Hiroshima et al. | 358/213 |
| 4,233,632 | 11/1980 | Akiyama | 358/212 |

Primary Examiner—Richard Murray
Attorney, Agent, or Firm—Burgess, Ryan & Wayne

[57] ABSTRACT

A solid-state image sensor in which a light signal charge transfer means comprising a metal oxide semiconductor (MOS) vertical shift register and switching elements is provided so that the light signal charge stored in the photoelectric transducer elements in one column in an (m×n) photoelectric transducer matrix array is simultaneously transferred to a vertical transmission line; and another charge transfer means comprising a transfer gate means and storage capacitor elements transfers the light signal charge transferred onto the vertical transmission line to a horizontal shift register from which the light signal charge is transferred to an output stage. The horizontal shift register comprises a charge-coupled device (CCD) type horizontal shift register. The solid-state image sensor can eliminate blooming caused by the incidence of light with a high intensity and smear caused by the incidence of light on the areas except predetermined light reception areas.

2 Claims, 6 Drawing Figures

SOLID STATES IMAGE SENSOR ARRAY HAVING CIRCUIT FOR SUPPRESSING IMAGE BLOOMING AND SMEAR

BACKGROUND OF THE INVENTION

The present invention relates to a solid-state image sensor which has a high resolution and a high signal-to-noise (S/N) ratio and can substantially avoid blooming and smear as well.

One of the most important requirements for solid-state image sensors is a high resolution so that it is preferable that the number of picture elements is increased as much as possible. Therefore, MOS-LSI techniques have been, in general, used because a higher degree of integration can be obtained in a relatively simple manner and an image unit, a shift register unit and a unit for coupling between them can be formed in a unitary construction.

In general, the solid-state image sensors can be divided into MOS type and CCD type. However, in practice, neither of these types can attain a satisfactory degree of high resolution and S/N ratio.

As will be described in detail below, in order to overcome the above and other problems encountered in the prior art MOS and CCD type solid-state image sensors, the inventors proposed in U.S. patent application Ser. No. 197,026, filed Oct. 15, 1980 a solid-state image sensor of the type comprising a plurality of photoelectric transducer elements arranged in an (m×n) matrix array; a charge transfer means comprising a light signal charge transfer means comprising a MOS vertical shift register and switching elements for simultaneously transferring the light signal charge stored in one column of photoelectric transducer elements to a vertical transmission line, transfer gates for transferring the light signal charge on the vertical transmission line to a horizontal shift register and storage capacitor elements; and a signal output stage for deriving light signal charge which has been horizontally transferred through the horizontal shift register which comprises a CCD type horizontal shift register.

The solid-state image sensor with the above-described construction can attain a high resolution and a high S/N ratio hitherto unattainable by the prior art solid-state image sensors, but still has much to be improved; that is, the resistance to blooming or capability of avoiding blooming. Blooming occurs when the charge generated by the incident light is in excess of the maximum charge storage capacity of a photoelectric transducer element. As described in the above U.S. patent application Ser. No. 197,026, even though the resistance to blooming or the anti-blooming characteristic is improved, when a spot of light (about 10% of the vertical direction of the whole area of the picture elements) is incident, the blooming charge reaches tens of times that generated when the light quantity is saturated. Therefore, in order to provide a solid-state image sensor which is satisfactory in practice, the resistance to blooming or the anti-blooming characteristic must be further improved.

In order to avoid blooming in the prior art MOS or CCD type solid-state image sensor, there have been proposed various methods, but no method has been devised which can fundamentally or completely avoid blooming.

SUMMARY OF THE INVENTION

The present invention, therefore, relates to a solid-state image sensor comprising a plurality of photoelectric transducer elements arranged in an (m×n) matrix array, a light signal charge transfer means comprising a MOS type vertical shift register and switching elements, whereby the light signal charge stored on the photoelectric transducer elements in one column can be simultaneously transferred to a corresponding vertical transmission line, another charge transfer means comprising transfer gates and storage capacitor elements, whereby the light signal charge transferred onto the vertical transmission line can be transferred into a horizontal shift register, and a signal output stage from which the light signal charge which has been horizontally transferred through the horizontal transfer means can be derived, said horizontal shift register being a CCD type shift register.

According to the present invention, not only blooming but also smear can be completely eliminated. In addition, an image unit is not needed to be provided with an additional structure such as an epitaxial structure, p-type well structure, overflow drains or overflow drain control gates. As compared with the prior art solid-state image sensors, not only the resolution and S/N ratio but also the anti-blooming and anti-smear characteristics are remarkably improved. As a result, the two-dimensional solid-state image sensor, in accordance with the present invention, has excellent characteristics which are needed for a single-plate solid-state color image sensor.

The above and other objects, effects and features of the present invention will become more apparent from the following description of preferred embodiments thereof taken in conjunction with the accompanying drawings.

DETAILED DESCRIPTION OF THE PRIOR ART

Figure 1:
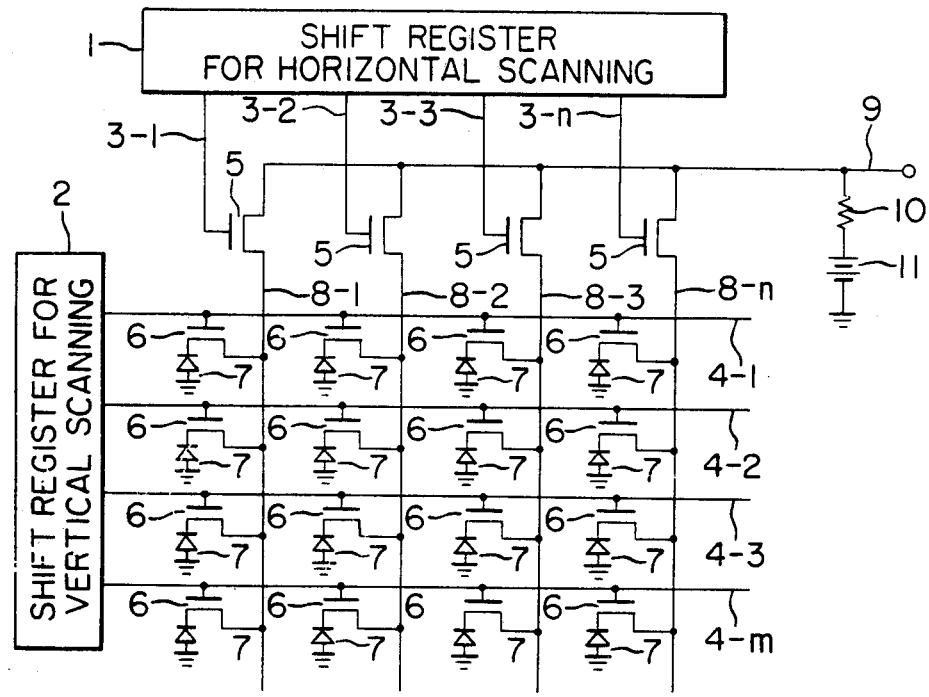
FIG. 1 is a view used for the explanation of the underlying principle of a MOS type two-dimensional solid-state image sensor.

Referring first to FIG. 1, the underlying principle of a MOS type solid-state image sensor will be described. A MOS type shift register 1 for horizontal scanning and a MOS type shift register 2 for vertical scanning are driven, in general, by two phase clock pulses. In response to the clock pulses, a start pulse which is applied to a first stage is shifted by a predetermined time so as to obtain the shift pulses which, in turn, are delivered to scanning pulse input lines 3-1, 3-2, . . . , and 3-n and 4-1, 4-2, . . . , and 4-m. In response to these pulse trains, horizontal MOS switches 5 and vertical MOS switches 6 are sequentially closed and opened, so that the signals from photodiodes 7 are derived by utilizing the diffusion layers in the sources of the vertical MOS switches 6 and delivered through vertical transmission lines 8-1, 8-2, ..., and 8-n to a video output line 9. The signal on the video output line 9 is the current derived from a video power supply 11 for recharging the diodes which have been discharged by the incidence of light during one frame period. The signal is read out through a load resistor 10.

Figure 2:
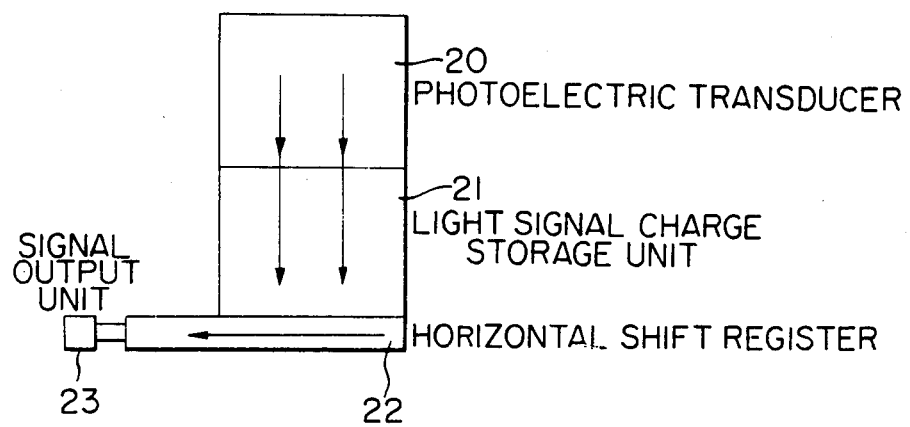
FIG. 2 is a view used for the explanation of the underlying principle of a CCD frame-transfer type two-dimensional solid-state image sensor.

In FIG. 2 is shown a typical example of the CCD type solid-state image sensors; that is, a frame transfer type solid-state image sensor. A photoelectric transducer or conversion unit 20 for storing the light signal charge comprises, in general, a surface channel type charge-coupled element. The light signal charge derived from the photoelectric transducer or conversion unit 20 is immediately frame-transferred to a light signal charge storage unit 21 during a vertical flyback time, the unit 21 being disposed adjacent to the unit 20. The light signal charge storage unit 21 usually comprises a surface channel type charge-coupled element. During a horizontal flyback time, the light signal charge is transferred from the unit 21 to a horizontal shift register 22 comprising buried channel type charge-coupled elements and then to a signal output unit 23 in response to suitable transfer clocks.

In the MOS type solid-state image sensor of the type described, each element in a column m and at a row n comprises a p-n junction so that the signal isolation between the adjacent picture elements is better. However, because of the gate capacitance of the horizontal MOS transistors and the floating capacitance between the gate and drain, the horizontal scanning pulses generated by the MOS type horizontal shift register 1 cause spike noise on the video output line. Variation in such spike noise is the main cause of the so-called fixed pattern noise which greatly decreases the S/N ratio of the video signal and presents the greatest drawback of the MOS type solid-state image sensor.

Meanwhile, the horizontal scanning shift register in the CCD frame-transfer solid-state image sensor comprises buried channel type charge-coupled elements so that the fixed pattern noise is extremely low and consequently the S/N ratio is better. However, because of the fundamental operation of frame-transferring the signal charge from the photoelectric conversion unit to the light signal charge storage unit and then sequentially transferring the signal charge to the horizontal shift register, more than m transfer steps must be carried out, so that transmission losses are inevitable. In addition, the degradation of the signal charge during the transfer varies depending upon the relative distance from the horizontal scanning shift register. Thus, neither of the systems is satisfactory for obtaining a high resolution and a high S/N ratio.

In order to overcome these problems, the inventors disclosed in Japanese Patent Application No. 135590/1979 a solid-state image sensor of the type comprising a plurality of photoelectric transducer elements arranged in an (m×n) matrix array; a charge transfer means comprising a light signal charge transfer means comprising a MOS vertical shift register and switching elements for simultaneously transferring the light signal charge stored in one column of photoelectric transducer elements to a vertical transmission line, transfer gates for transferring the light signal charge on the vertical transmission line to a horizontal shift register and storage capacitor elements; and a signal output stage for deriving the light signal charge which has been horizontally transferred through the horizontal shift register which comprises a CCD type horizontal shift register.

Figure 3A:
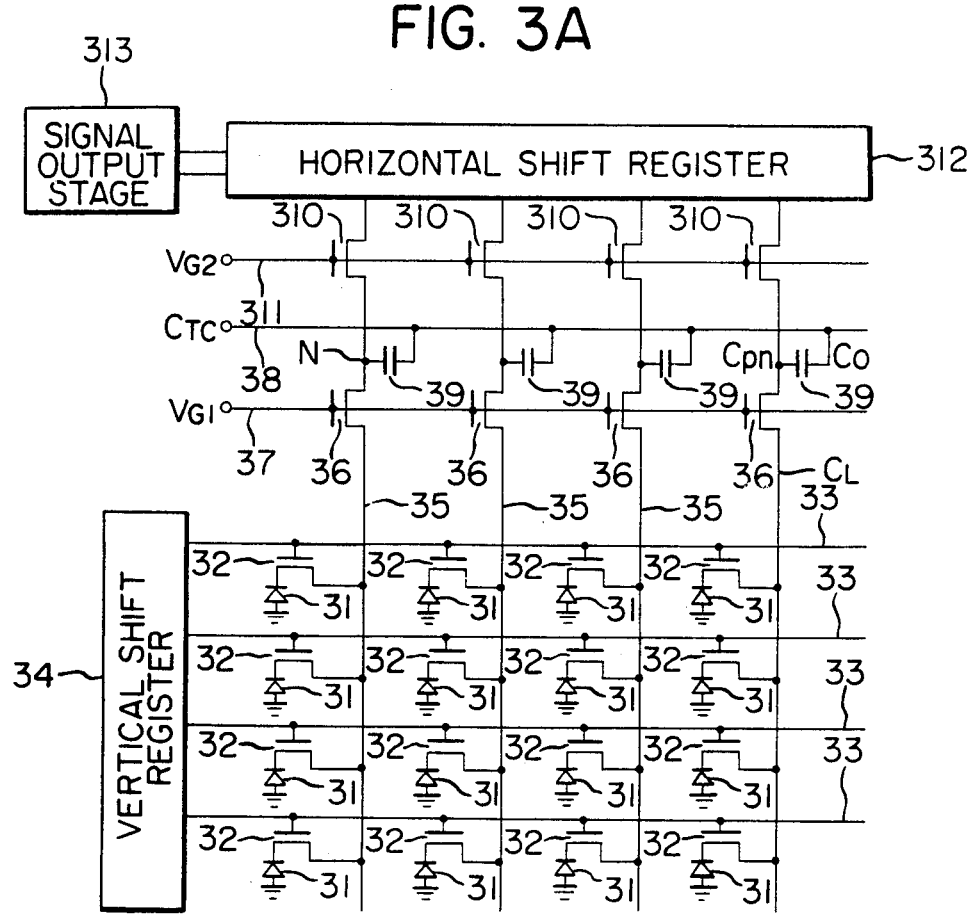
FIG. 3A is a circuit diagram of a solid-state image sensor disclosed in U.S. patent application Ser. No. 197,026.

In FIG. 3 is shown one example of the embodiments disclosed in the above-described Japanese Patent Application. Picture elements each comprising a photodiode 31 and a vertical MOS switch 32 connected thereto are arranged in an (m×n) matrix array; that is, in a (4×4) matrix array in FIG. 3A for the sake of simplicity. The gates of the vertical MOS switches 32 in each column are connected, in common, to a vertical scanning pulse input line 33 which, in turn, is connected to a MOS type vertical shift register 34. The drains of the vertical MOS switches 32 in each row are connected in common to a vertical transmission line 35 which, in turn, is connected to the source of a transfer MOS transistor 36 which has a first transfer gate. The gates of the transfer MOS transistors 36 are connected, in common, to a first gate input line 37. One end of each of the storage capacitor elements 39 is connected, in common, to a storage gate input line 38 while the other ends thereof are connected to the drains, respectively, of the transfer MOS transistors 36, whereby a storage unit N is provided. Second transfer gates 310 are connected, in common, to a second gate input line 311. A buried channel CCD type horizontal shift register 312 (to be referred to as the "horizontal shift register" hereinafter for brevity) is disposed adjacent to the second transfer gates 310 and connected to a signal output stage 313. In the following explanation, all the MOS switches are assumed to be of the N-channel enhancement type, but the mode of operation is substantially similar even when other types of MOS switches are used.

The mode of operation of the solid-state image sensor with the above-described construction is described in detail in the above-described Japanese Patent Application No. 135590/1979, so that no further description shall be made in this specification.

Figure 3B:
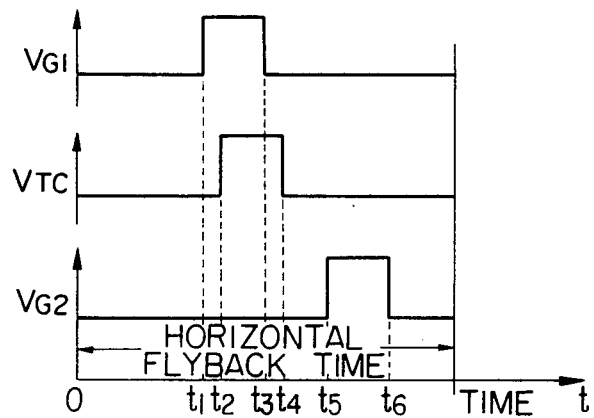
FIG. 3B is a timing diagram of driving pulses used for the explanation of the mode of operation thereof.

As shown in FIG. 3B, self-biased charge transfer pulses which occur from time $t_1$ to $t_6$ are used as driving pulses.

The solid-state image sensor of the type described above has a high resolution and a high S/N ratio hitherto unattainable by any prior art image sensor. However, when light is incident which generates the charge in excess of the maximum storage capacity of the photoelectric transducer element, blooming results. The suppression of blooming is described in conjunction with some embodiments in the above-described Japanese Patent Application No. 135590/1979. When a spot of light (about 10% of the vertical direction of the whole area of picture elements) is incident, blooming is tens of times the saturating light quantity. Therefore, the solid-state image sensor of the type described must be further improved so that blooming may be satisfactorily suppressed even when light with a higher intensity is incident on the picture elements.

In order to suppress blooming in the MOS or CCD type solid-state image sensors, there have been proposed various methods. For instance, there has been proposed a scheme for providing overflow drains and overflow drain control gates in an image unit, but the density of integration is limited. In addition, the area of a light sensor is sacrificed so that the sensitivity is degraded. There has been also proposed a method in which an image unit comprises the epitaxial structure so that the charge causing blooming may be transferred to a substrate. However, the anti-blooming characteristic is of the order of ten times the saturating light quantity, which is not satisfactory in practice. Thus, for the MOS or CCD type solid-state image sensor, there has not been proposed a fundamental solution for the blooming problem.

DESCRIPTION OF THE PREFERRED EMBODIMENTS

The present invention provides a solid-state image sensor which has a higher degree of anti-blooming characteristic hitherto unattainable by the prior art and a high resolution, a high S/N ratio and a high sensitivity as well.

Figure 4A:
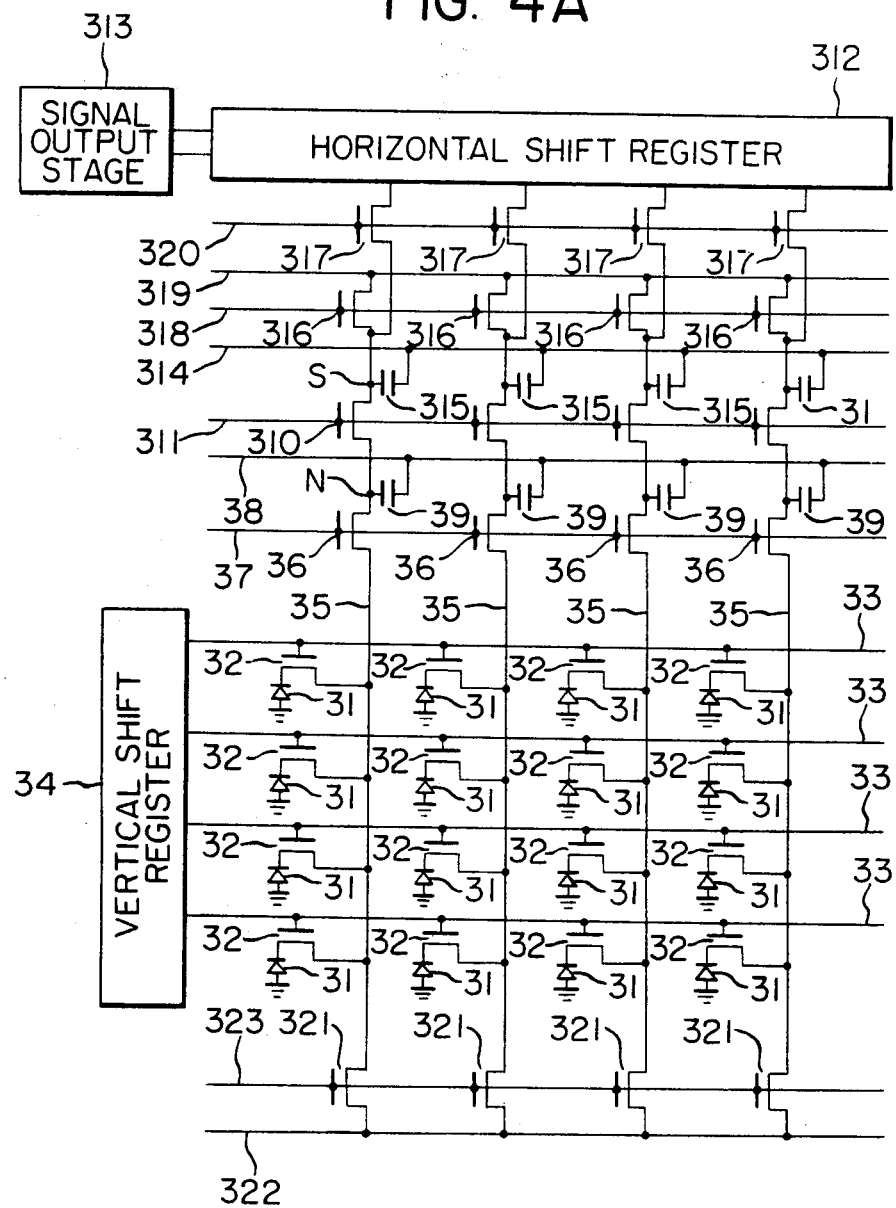
FIG. 4A is a circuit diagram of a preferred embodiment of the present invention.

In FIG. 4A is shown a circuit diagram of a two-dimensional solid-state image sensor in accordance with the present invention in which a plurality of picture elements each comprising a photodiode 31 and a vertical MOS switch 32 connected thereto are assembled in an (m×n)matrix array; that is, in the (4×4) matrix array in FIG. 4A for the sake of simplicity. The gates of the vertical MOS switches 32 in each column are connected, in common, to a vertical scanning pulse input line 33 which, in turn, is connected to a MOS type vertical shift register 34. The drains of the vertical MOS switches 32 in each row are connected, in common, to a vertical transmission line 35 which, in turn, is connected to the source of a transfer MOS transistor 36 with a first transfer gate. One end of each of the storage capacitor elements 39 are connected, in common, to a storage gate input line 38 while the other ends thereof are connected to the drains, respectively, of the transfer MOS transistor 36, whereby a storage unit N is provided. Second transfer gates 310 are located adjacent to the capacitor elements 39 and connected, in common, to a second gate input line 311. One end of each of the connecting capacitor elements, which are MOS capacitors, are connected, in common, to a MOS capacitor input line 314 while the other ends thereof are connected to the drains of the transistors, whereby a connecting unit S is provided. The sources of a third transfer gate 316 and a fourth transfer gate 317 are connected to the connecting unit S. The gates of the third transfer gate 316 are connected, in common, to a third gate input line 318. The drains of the third transfer gate 316 are connected, in common, to a sweep drain line 319. A buried channel CCD type horizontal shift register 312 (to be referred to as "the horizontal shift register" hereinafter for brevity) is located adjacent to the fourth transfer gates 317 and is connected to a signal output stage 313. The gates of the fourth transfer gates 317 are connected, in common, to a fourth gate input line 320. The ends of the vertical transmission line 35 opposite to the ends connected to the first transfer gates 36 are connected to the sources of fifth transfer gates 321. The drains of the transfer gates 321 are connected, in common, to an overflow drain line 322 and the gates are connected, in common, to a fifth gate input line 323.

Next, the mode of operation will be described. Assume that incident light is so strong as to cause blooming. Then, the blooming charge overflowing from the photodiodes 31 flows into the vertical transmission line 35 through the channels under the gates of the vertical MOS switches 32. During one horizontal scanning time, a suitable voltage is impressed on the transfer gate input line 323, so that the fifth transfer gates 321 are turned on and subsequently almost all the blooming charge on the vertical transmission lines 35 is discharged through the overflow drain line 322. Thereafter, the transfer gates 321 are turned off. In the next horizontal scanning time, the self bias charge transfer pulses are applied to the pulse input lines 37, 38 and 311, so that all the remaining blooming charge is discharged through the storage units N to the connecting units S. Thereafter, the blooming charge transferred to the connecting units S is discharged through the transfer gates 316 to the sweep drain line 319. In this case, the channel potential under the transfer gates 317 is maintained lower than the channel potential under the transfer gates 316 so that no blooming charge flows into the horizontal shift register 312. When these steps are accomplished, no blooming charge exists on the vertical transmission lines 35. Next, the vertical scanning pulses are applied to the vertical MOS switches 32, so that the signal charge stored on the photodiodes 31 is transferred to the vertical transmission line 35. The signal charge on the vertical transmission line 35 is transferred through the storage unit N to the connecting unit S based upon the self bias charge transfer and concurrently to the horizontal shift register 312 through the transfer gate 317. The channel potential under the transfer gate 317 is maintained higher than the channel potential under the transfer gate 316 so that no signal charge flows into the sweep drain line 319. The signal charge transferred into the horizontal shift register 312 is transmitted to the signal output stage 313 and read out in response to suitable transfer clock pulses. After the signal charge has been transferred to the connecting unit S, the transfer gate 321 is turned on, so that the blooming charge overflowing from the photodiodes during the next horizontal scanning time is discharged to the overflow drain line 322. The same steps are repeated in the succeeding horizontal scanning time.

Figure 4B:
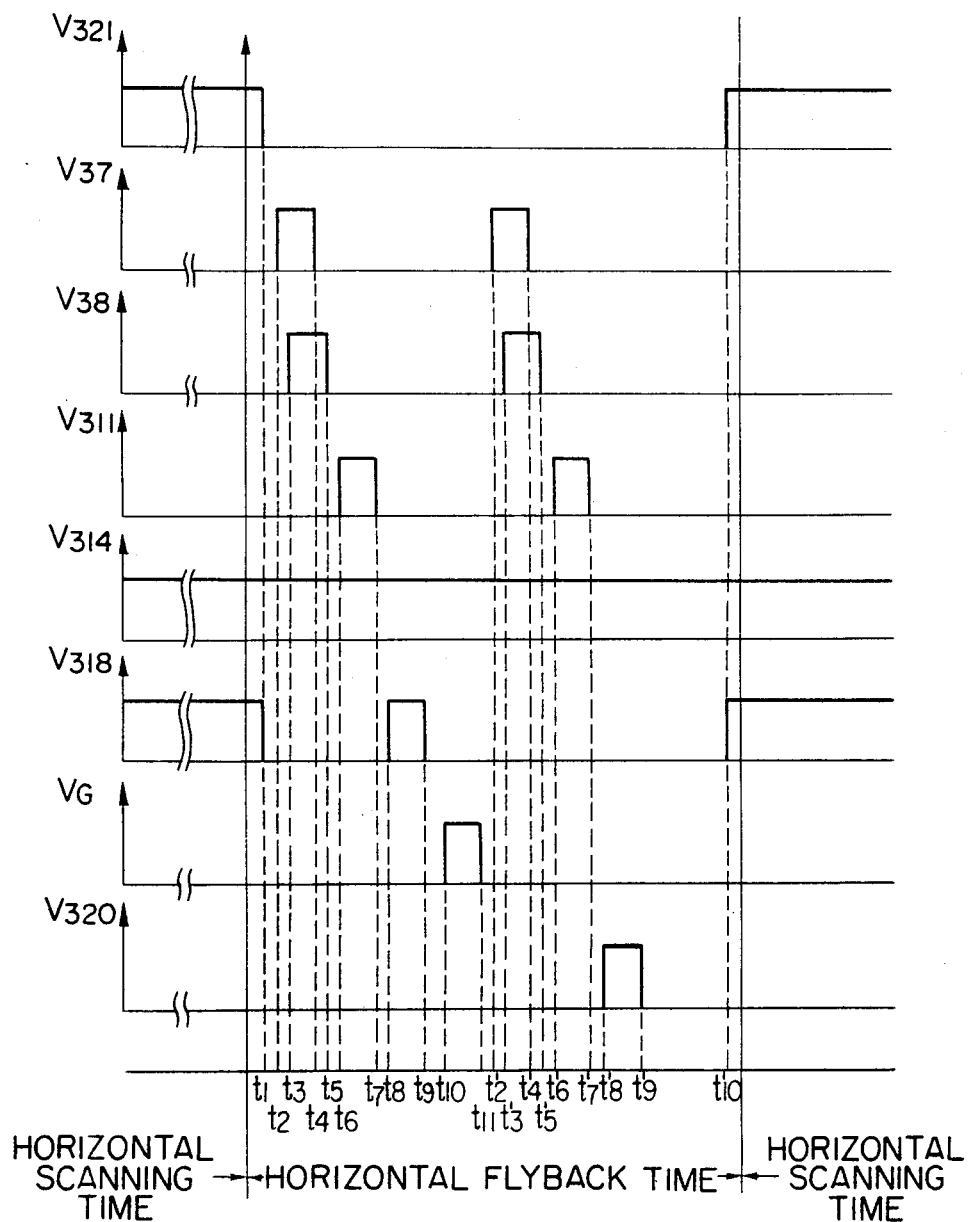
FIG. 4B is a timing diagram of driving pulses used for the explanation of the mode of operation thereof.
Figure 5:
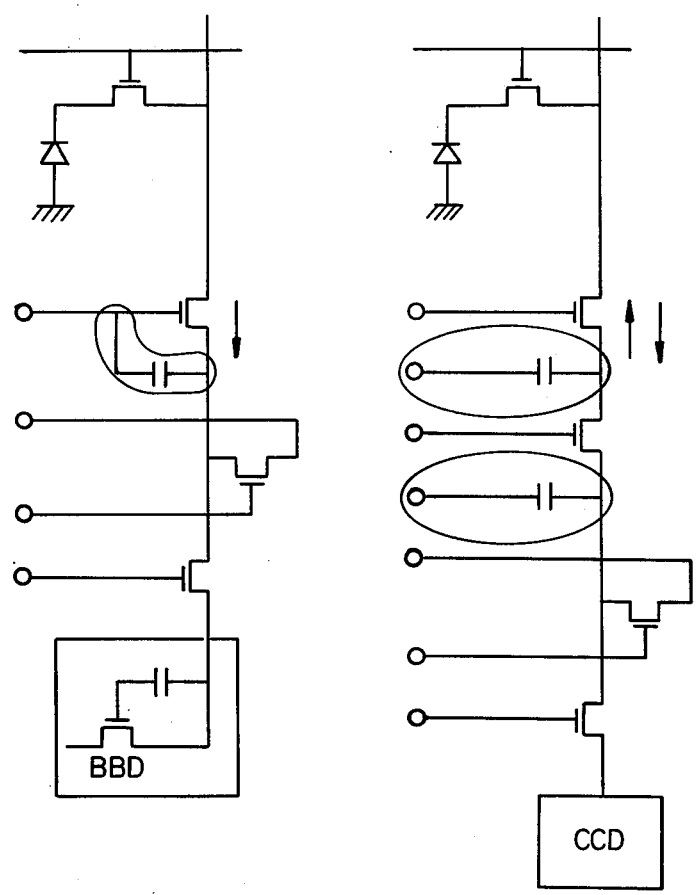

In FIG. 4B is shown the timing diagram of driving pulses in response to which the above-described steps are carried out. Potentials $V_{321}$, $V_{37}$ and $V_{38}$ indicate the waveforms of the pulse voltages applied to the pulse input lines 321, 37 and 38, respectively. Potential $V_G$ shows the vertical scanning pulse applied to the vertical shift register 34. $V_L$ and $C_L$ denote the potential and capacitance of the vertical transmission line 35 when the latter is low. The charge $Q_B$ overflowing from the photodiode 31 which is subjected to blooming flows to the vertical transmission line 35. In one horizontal scanning time, the transfer gates 321 are turned on, so that the blooming charge is discharged through the overflow drain line 322, for instance, in the saturation mode. A voltage to be applied to the transfer gates 321 is so selected that the channel potential $V'_{321}$ under the transfer gates 321 may satisfy the following relation:

$$V'_{321} = V_{321} - V^T_{321} \leq V_L$$

where $V^T_{321}$ is the threshold voltage of the transfer gates 321. As a result, the blooming charge $Q_B$ on the vertical transmission lines 35 is nearly discharged to the overflow drain line 322 so that the blooming charge $Q_B'$ still remaining on the vertical transmission lines 35 becomes on the order of $C_L (V_L - V'_{321})$.

Therefore, when the value of $(V_L - V'_{321})$ is made as minimum as possible, the remaining blooming charge $Q_B'$ can be made almost equal to the storage capacitance of one photodiode 31. At $t_1$ in the next horizontal flyback time, the pulse voltage becomes $V_{321}$ again. Under these conditions, the blooming charge $Q_B'$ remains on the vertical transmission lines 35. Next, from $t_2$ to $t_7$ the self bias charge transfer pulses are so utilized as to transfer the blooming charge $Q_{B'}$ remaining on the MOS capacitors 315 through the storage units N at a high efficiency rate. At $t_8$, the pulse voltage $V_{318}$ is applied to the transfer gate input line 318 so that the charge $Q_{B'}$ is transferred on the sweep drain line 319. Under these conditions, no blooming charge remains on the vertical transmission lines 35. Thereafter, at $t_{10}$ the vertical scanning pulse $V_G$ is generated by the vertical shift register 34 and applied to the vertical MOS switches 32. Then, since the capacitance $C_L$ of the vertical transmission line 35 is by far greater than the capacitance $C_{PD}$ of the photodiode 31, the signal charge stored in the photodiode 31 is transferred onto the vertical transmission line 35. From $t'_2$ to $t'_7$ the self biased charge transfer pulses are used to transfer the signal charge on the vertical transmission line 35 to the connecting MOS capacitor 315 at a higher efficiency rate. Next, at $t'_8$ the pulse voltage is applied to the transfer gate input line 320, so that the signal charge is transferred into the horizontal shift register 312. Prior to the next horizontal scanning time, the pulse voltage is applied again to the transfer gates 321 at $t'_{10}$, so that the blooming charge overflowing to the vertical transmission lines 35 may be discharged to the overflow drain line 322 in the succeeding horizontal scanning time. During the horizontal scanning time, in response to the suitable transfer clock pulses, the signal charge is transferred to and read out at the signal output stage 313. The above-described steps are repeated in the next horizontal flyback time succeeding the horizontal scanning time.

Because of the mode of operation described above, even when the connecting MOS capacitors 315 are eliminated, the operation is not adversely affected at all, but if they were not provided, the transfer gates 310 would be very likely to be modulated through the transfer gates 317, so that noise would be generated. Furthermore, the provision of the connecting MOS capacitors 315 results in the advantage that the width and length of the gates of the transfer gates 316 and 317 may be increased.

According to the present invention, it is possible to eliminate the blooming charge overflowing from the photodiodes to the vertical transmission lines prior to the reading of the true signal charge, so that no blooming occurs. In addition, as compared with the prior art schemes for providing the overflow drain structure in the image unit or the epitaxial structure or p-type wells in the image unit so that the blooming charge is discharged to the substrate, the density of integration can be improved. As a result, according to the present invention, the chip can be made very compact in size and the density of picture elements can be increased.

So far the self bias charge transfer pulses are used once in order to transfer the blooming charge or signal charge, but it is to be understood that they may be used a suitable number of times during one effective horizontal flyback time so that the transfer efficiency can be improved.

In addition to the driving pulses shown in FIG. 4B, various other pulses may be used as will be described below. The transfer gates 321 may be used as switches. In the latter case, the potential on the overflow drain line 322 is maintained lower than $V_L$ in the horizontal flyback time and the transfer gates 322 are operated in the switch mode, so that the blooming charge on the vertical transmission lines 35 are completely discharged to the overflow drain line 322. Therefore, the charge which is injected in the switch mode from the overflow drain line 322 is remaining on the vertical transmission lines 35. Thereafter, in response to the self bias charge transfer pulses as shown in FIG. 4B, the transferred charge is swept out to the sweep drain line 319 and then the signal charge from the photodiodes 31 is transferred to the horizontal shift register 312 and then to the signal output stage 313 to be read out.

Another example of driving pulses will be described. The transfer gates 321 are held in the off state during all the time periods. First, a suitable voltage is applied to the pulse input lines 37, 38 and 311 during one horizontal scanning time, so that the blooming charge on the vertical transmission lines 35 is transferred to the connecting MOS capacitors 315 and then almost all the blooming charge is discharged to the sweep drain line 319 through the transfer gate input line 318. During the next horizontal flyback time, in response to the pulses $V_{37}$, $V_{38}$ and $V_{311}$ as shown in FIG. 4B, the remaining blooming charge is discharged to the sweep drain line 319 in the self bias charge transfer mode and then the signal charge is transferred to the horizontal shift register 312 and read out at the output stage 313. The pulse voltage $V_{311}$ may be DC during the whole horizontal flyback time or the pulse voltage $V_{314}$ may be DC only during the horizontal flyback time. In general, various other driving pulses can be employed as long as the charge transfer principle in accordance with the present invention is carried out.

In summary, according to the present invention, blooming can be completely eliminated in the solid-state image sensor. In addition to blooming, the phenomenon called "smear" occurs in the solid-state image sensor. This phenomenon is caused because the charge generated by light incident in vicinity of the drains which connected to the vertical transmission lines is collected in the drains and mixed with the true light signal charge so that the S/N ratio is degraded. (This charge is called "dark current charge" or "false light signal charge".) It is apparent that according to the present invention the false light signal charge which results in smear can be eliminated in a manner substantially similar to that described above in conjunction with the elimination of the blooming charge. In addition, the dark current charge generated on the vertical transmission line during the horizontal scanning time can be also eliminated. Thus, the extremely high quality video signal can be derived. It is impossible for the prior art MOS or CCD type solid-state image sensors to eliminate the false light signal charge because of their underlying principles.

When a solid-state image sensor comprises a large number of picture elements, the even- and odd-numbered vertical transmission lines are assembled as shown in FIG. 4A, respectively, so that the transmission losses due to the high-speed operation of the horizontal shift register can be avoided. In addition, the density of integration can be further improved.

What is claimed is:
1. A solid-state image sensor comprising:
 a plurality of photoelectric transducer elements arranged in a matrix array consisting of m columns and n rows, for storing charge corresponding to a light image impinging thereon;
 first charge transfer means comprising metal-insulator-semiconductor vertical shift resister means and switching means for transferring the light image charge stored in said photoelectric transducer elements to corresponding vertical transmission lines;

second charge transfer means for transferring the charge transferred from said transducer elements to said vertical transmission lines, to corresponding charge-coupled horizontal shift register means;

first storage capacitor means having a capacitance lower than that of said vertical transmission lines;

means for applying a first pulse voltage to one electrode of said first storage capacitor means, the other electrode thereof serving as a storage means;

first transfer gate means responsive to a second pulse voltage for effecting charge transfer between said storage means and said vertical transmission lines;

second transfer gate means responsive to a third pulse voltage for effecting charge transfer from said storage means to said horizontal shift register means;

third charge transfer means interposed between said first storage capacitor means and said second charge transfer gate means and comprising a second storage capacitor means;

means for applying a voltage to one electrode of said second storage capacitor means, the other electrode thereof serving as storage means;

fourth transfer gate means and drain means adjacent said second storage means, for discharging the charge therein except for said light signal charge; and fourth charge transfer means coupled to said fourth transfer gate means for discharging the charge except said light signal charge to one electrode of a corresponding one of each of said vertical transmission lines.

2. A solid-state image sensor as set forth in claim 1, wherein said forth charge transfer means comprises transfer gate means and a drain means.

* * * * *

UNITED STATES PATENT AND TRADEMARK OFFICE
CERTIFICATE OF CORRECTION

PATENT NO. : 4,450,484
DATED : May 22, 1984
INVENTOR(S) : Sumio Terakawa, et al.

It is certified that error appears in the above-identified patent and that said Letters Patent is hereby corrected as shown below:

In each of Figures 1, 2, 3A and 3B, insert --PRIOR ART--.

Signed and Sealed this

Twenty-second Day of January 1985

[SEAL]

Attest:

DONALD J. QUIGG

Attesting Officer     Acting Commissioner of Patents and Trademarks